United States Patent [19]

Challa

[11] Patent Number: 5,222,040
[45] Date of Patent: Jun. 22, 1993

[54] SINGLE TRANSISTOR EEPROM MEMORY CELL

[75] Inventor: Nagesh Challa, Sunnyvale, Calif.

[73] Assignee: Nexcom Technology, Inc., Sunnyvale, Calif.

[21] Appl. No.: 625,807

[22] Filed: Dec. 11, 1990

[51] Int. Cl.⁵ ............................................. G11C 13/00
[52] U.S. Cl. .................................. 365/185; 365/186; 365/218; 365/900
[58] Field of Search ............... 365/185, 218, 186, 900

[56] References Cited

U.S. PATENT DOCUMENTS

| | | |
|---|---|---|
| 4,366,555 | 12/1982 | Birdsall . |
| 4,698,787 | 10/1987 | Mukherjee et al. . |
| 4,758,986 | 7/1988 | Kuo . |
| 4,884,239 | 11/1989 | Ono et al. . |
| 4,903,236 | 2/1990 | Nakayama et al. . |
| 4,996,571 | 2/1991 | Kume et al. ............... 365/218 |

FOREIGN PATENT DOCUMENTS 0218342 8/1986 European Pat. Off. .
0313427 9/1988 European Pat. Off. .

OTHER PUBLICATIONS

Gill, M., et al., "A 5-Volt Contactless Array ..." *IEEE IEDM 88*, 1988, pp. 428–430.

*Primary Examiner*—Terrell W. Fears
*Attorney, Agent, or Firm*—Law Offices of Thomas E. Schatzel A Prof. Corporation

[57] ABSTRACT

A single-transistor non-volatile memory cell MOS transistor with a floating gate and a control gate using two levels of polysilicon and a tunnel dielectric that overlaps the drain area wherein a tunneling of charge can take place between the drain and the floating gate by means of a system of applied voltages to the control gate and drain.

18 Claims, 2 Drawing Sheets

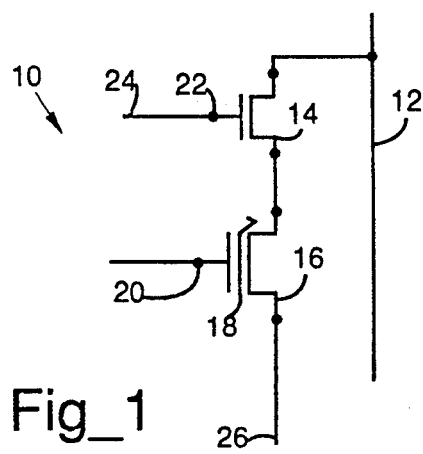
Fig_1
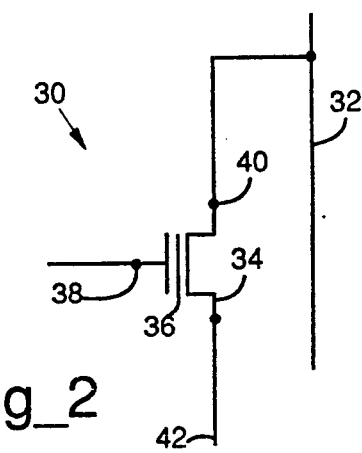
Fig_2
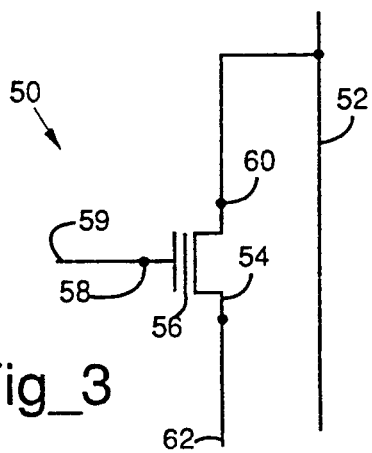
Fig_3
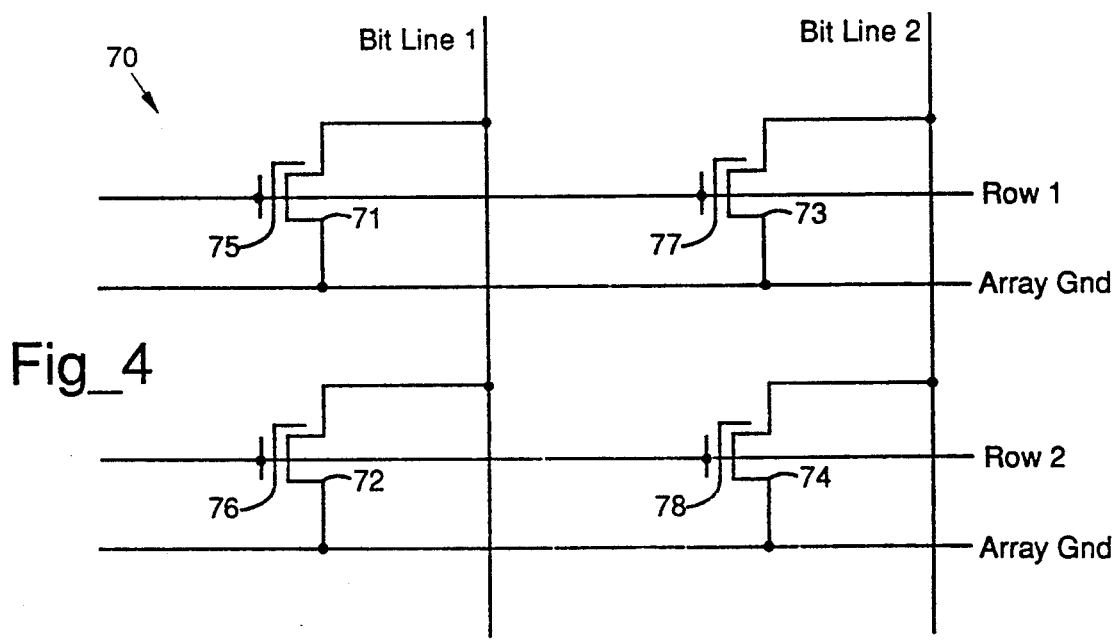
Fig_4

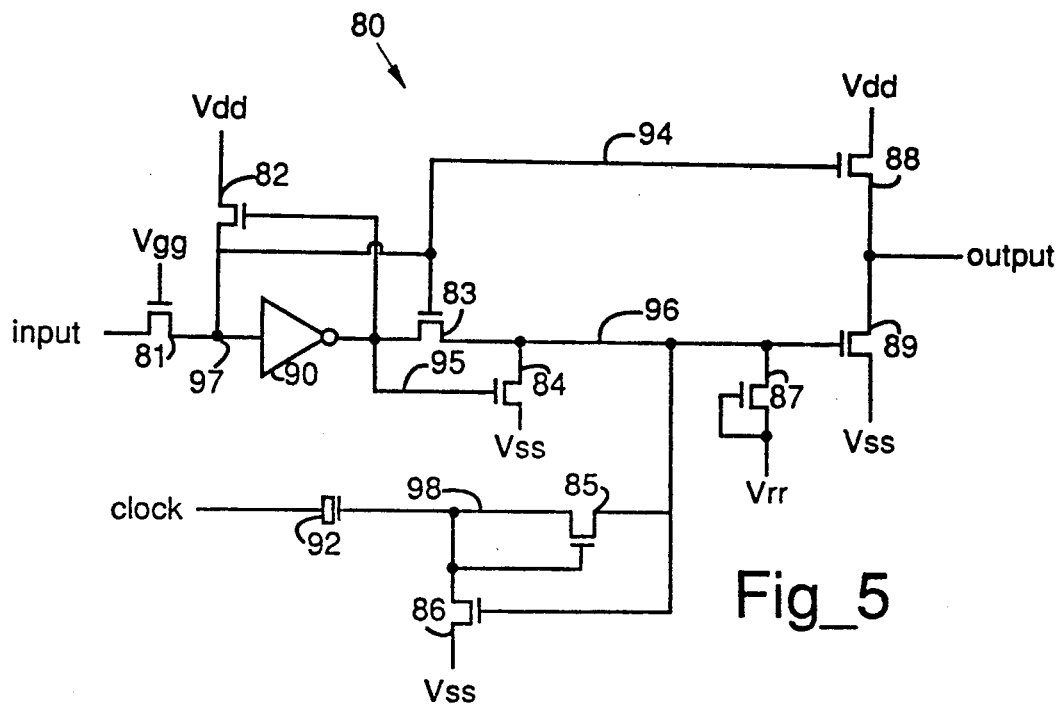
Fig_5
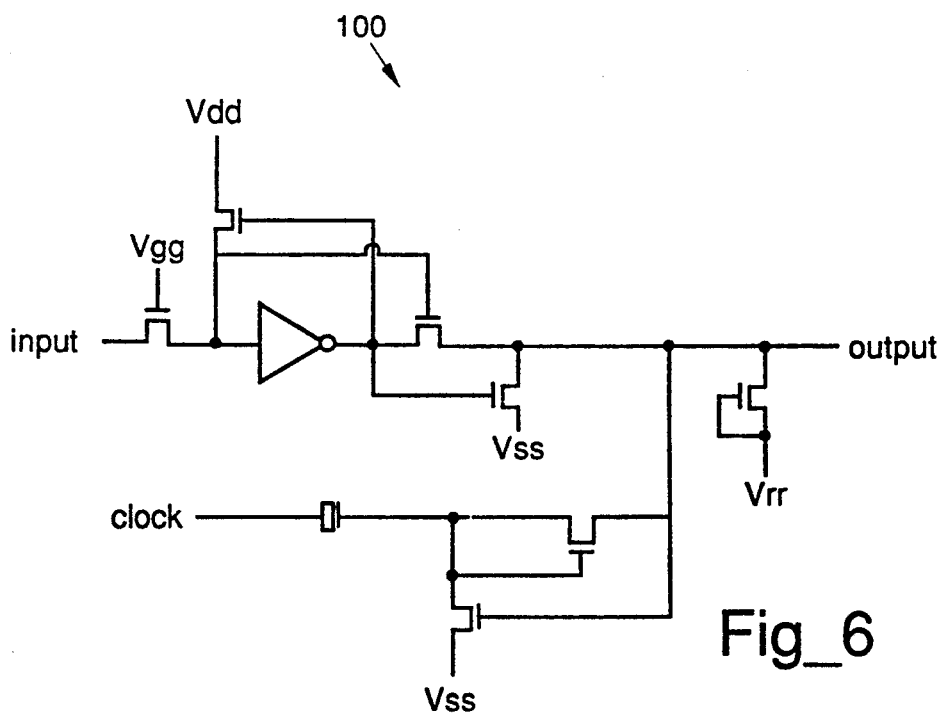
Fig_6

SINGLE TRANSISTOR EEPROM MEMORY CELL

BACKGROUND OF THE INVENTION

1. Field of the Invention

The invention relates generally to non-volatile computer memory devices and more specifically to very high density devices made possible by using one as opposed to two transistors per memory cell.

2. Description of the Prior Art

Electrically programmable read only memory (EPROM) cells are among the smallest memory cells in the prior art. Electrically erasable EPROMs (called E²PROMs) traditionally have had larger cell sizes because two transistors were necessary for each memory cell. Some so called "flash" EPROMs also have cells as small as EPROMs. Flash memories sort themselves into two basic approaches, distinguished by whether they require one or two voltage supplies. (See, Samuel Weber, "Look Out, Here Comes Flash," *Electronics*, November 1990, pp. 44-50.) These designs also differ in their cell structure—whether they require one or several transistors per cell. Intel Corporation (Santa Clara, Calif.) has a one-transistor self-aligned stacked-gate cell, based on its proprietary ETOX (EPROM tunnel-oxide) technology. Intel recently announced a very high density flash device, the 28F020, that stores two megabits. Catalyst, Excel, Hitachi, Mitsubishi, and Toshiba all offer competing devices. A problem with the the single-transistor cell is the possibility of over-erasure and consequent current leakage. This can result in false data readings when a cell in the zero state receives an erase pulse that drives it into the depletion mode. The column-sense amplifier will read this incorrectly as an erased cell. Intel, and others, have overcome this with a programming algorithm that first programs up all the cells on a chip to a "one" before erasing. Seeq Technology (San Jose, Calif.) solves the problem by using a different cell structure. A split-gate cell amounts to a two-transistor architecture, but takes only a little more chip area than a single transistor cell. (According to Weber, supra.) Through a diffusion process, the split-gate creates a phantom transistor that looks like as series transistor. This allows the cell to be isolated from others in a column. The Seeq devices (e.g., 48F512 and 48F010) have the ability to do sector-erase of any of 128 columns. Samuel Weber (supra) expects Misubishi Corp. (Japan) to show a single-transistor, stacked-gate cell of only 3.6 μm² in a 16M-bit flash at the upcoming International Electron Devices Meeting (IEDM).

FIG. 1 illustrates a typical EEPROM memory cell 10 of the prior art comprising a bit line 12, a select transistor 14, a floating gate transistor 16 having a floating gate 18 and a control gate 20, a select gate 22 connected to a word line 24, and an array source 26. Transistor 16 is a floating-gate avalanche-injection metal oxide semiconductor (FAMOS) and is well known in the prior art. (For a background of these devices see, U.S. Pat. No. 4,884,239, issued Nov. 28, 1989, to Ono, et al.) To erase cell 10, a high voltage (about 20V)is placed on gates 20 and 22, while array source 26 and bit line 12 are at ground. The high voltage on gate 20 is coupled to floating gate 18 by virtue of capacitive coupling. The voltage on gate 18 is a function of the coupling ratio $v$. (Depending on the technology used, the coupling ratio will vary, and so will the voltages used.) Therefore $V_{18} = vV_{20}$. Once $V_{18}$ reaches a critical level (typically ~11V) the field across the tunnel oxide area of transistor 16 is enough to start electron tunneling from the drain of transistor 16 to gate 18 through the thin (~100 Å) tunnel oxide. This results in a relatively high threshold voltage ($V_t$) for transistor 16. To program cell 10, control gate 20 is grounded, high voltages (~20V) are placed on bit line 12 and select gate 22, while array source 26 is left to float. The high voltage on bit line 12 transfers through transistor 14 to the drain of transistor 16. An electric field is produced across the tunnel oxide area of transistor 16 to start tunneling of electrons in the direction opposite to the above. This results in transistor 16 having a low threshold voltage ($V_t$, which can be −2V to −3V). This threshold voltage is the reason that transistor 14 is needed in read mode because transistor 16 cannot be controlled for reading by 5 gate 20. Since a high voltage on only one terminal, control gate 20 or the drain of transistor 16, is needed to program and erase, the select gate 22 is needed for these modes.

FIG. 2 illustrates a prior art single-transistor flash EPROM memory cell 30 comprising a bit line 32 and a memory transistor 34 having a floating gate 36, a control gate 38 connected to a word line, a drain 40, and an array ground 42. To erase cell 30, control gate 38 and bit line 32 have a high voltage (~12V to 15V) applied. This puts transistor 34 in a high current mode drawing about one milliamp from bit line 32 to array ground 42. Hot electrons are generated and get trapped in floating gate 36. (This is the standard EPROM programming mode.) To program cell 30, control gate 38 is grounded and array ground 42 is at high voltage. Bit line 32 is floating and electrons tunnel through the thin gate oxide of transistor 34 to array ground 42. This results in a low $V_t$ state for transistor 34.

A pass transistor can prevent memory cells from drawing current when the floating gate structure is erased into depletion. (See, Gill, et al., "A 5-Volt Contactless Array 256KBIT Flash EEPROM Technology," IEDM 88, IEEE, pp.428-431.) Such pass, or read select, transistors are routinely used in the prior art. A contactless cell array technology is described by Gill, et al. (supra), for a single power supply 5V-only flash EEPROM. The contactless flash EEPROM cell is a one-transistor floating gate structure (defined by double poly stack process) merged with a series enhancement pass gate. The cell erase is accomplished by Fowler-Nordheim tunneling from floating gate to source junction by applying a negative voltage on the word line and $V_{cc} = 5V$ on the source line (Id., FIG. 4). There is no significant change in the erased state threshold voltage because of the merged pass gate. Since the floating gate structure can be over-erased into depletion, the cell Vt is dominated by the pass gate characteristics.

The disadvantages of the prior art for EEPROM are that two transistors are needed, making high density difficult, and bit line 12 is at high voltage causing spacing concerns between adjacent lines. In flash EPROMs the problems are again high voltages being placed on bit lines 32, high currents needed to program the cell 30, and elimination of page mode because too much current is needed. The write operation can produce negative thresholds and complicated algorithms are necessary to work around the problem.

SUMMARY OF THE PRESENT INVENTION

It is therefore an object of the present invention to produce a single transistor E²PROM memory cell.

Briefly, a single transistor EPROM device of the present invention comprises an array of single transistor memory cells and a controller capable of providing bipolar voltage levels to the array.

An advantage of the present invention is that very high density EPROM devices are possible that have the programming and reading simplicity of E²PROM devices.

Another advantage of the present invention is that lower voltages are used and smaller device geometries may be used.

Another advantage of the present invention is that the select transistor is eliminated.

Another advantage of the present invention is that the need to submit a flash memory cell to a high current hot electron injection mode is eliminated, thus allowing page mode programming.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a prior art E²PROM memory cell;

FIG. 2 is a schematic diagram of a prior art EPROM or FLASH memory cell;

FIG. 3 is a schematic diagram of a memory cell of the present invention;

FIG. 4 is a schematic diagram of a four cell memory device;

FIG. 5 is a schematic diagram of a control circuit capable of driving the row and bit lines of the devices of FIGS. 3 and 4; and FIG. 6 is a schematic of an alternative control circuit to replace the one of FIG. 5.

DETAILED DESCRIPTION OF THE PREFERRED EMBODIMENTS

FIG. 3 is a memory cell of the present invention, referred to by the general reference numeral 50, comprising a bit line 52 and a memory transistor 54 having a floating gate 56, a control gate 58 connected to a word line 59, a drain 60, and an array source 62. An erase changes transistor 54 to a high Vt state. To erase cell 50, both bit line 52 and array source 62 are grounded, and control gate 58 has a high voltage applied. This results in charging floating gate 56 with a negative charge and therefore a high threshold Vt. This scheme is similar to a prior art E²PROM. To program cell 50, a minus 15V is applied to control gate 58, plus 5V to bit line 52, and array source 62 is left floating. This results in a field across the tunnel oxide area of transistor 54 similar to that in FIG. 1 in the programming mode. Depending on the coupling ratio $v$, floating gate 56 will have a net negative voltage and the drain 60 a positive 5V. (As was said above, depending on the technology used, the coupling ratio will vary, and so will the voltages used.) Therefore, floating gate 56 will be stripped of negative charge and transistor 54 will reach a low or negative threshold state. To read memory cell 50, control gate 58 is minus 3V if deselected and plus 3v if selected. This eliminates the need of a select transistor. Even with transistor 54 with a negative threshold voltage, memory cell 50 will be OFF with the minus 3V on the word line 59. A standard flash EPROM process can be used to fabricate cell 50. The source and drain in such a cell are reversed. (The source side in a flash EPROM cell typically has the underlap diffusion (under the floating gate) to enable tunneling.) Alternatively, a negative back bias can be used for the substrate to achieve similar operation to that described above. In this alternative case, the drain of the memory cell would be minus 5V during erase, with the gate at plus 15V. During programming, the drain of the memory transistor would be plus 5V with the control gate at minus 15V. The overall magnitude of voltage pumped would be smaller in any event. This would enable the running of the device from a lower power supply.

FIG. 4 illustrates a memory device 70 comprised of a group of four memory transistors 71-74 having floating gates 75-78, respectively. Table I summarizes the operational states of bit lines one and two, and row lines one and two for erase, write, and read operations. It is important to note that none of the bit lines exceed zero to five volts in any mode. This allows the bit lines, which are customarily diffusions, to be placed closer together, thus allowing higher device densities.

TABLE I

|  | Row 1 (on) | Row 2 (unselected) | Bit Line 1 "0" | Bit Line 2 "1" | Array Gnd. |
| --- | --- | --- | --- | --- | --- |
| Erase (High Vt "1") | +20 V | 0 V | 0 V | 0 V | 0 V |
| Write (Low Vt "0") | −15 V | 0 V | +5 V | 0 V | +5 V |
| Read | +1 V | −3 V | 2 V | 2 V | 0 V |

FIG. 5 is a control circuit 80 that will supply the appropriate voltages in support of memory device 70 or memory cell 50. The Vdd, Vss, and Vrr of control circuit 80 are connected to different voltage supplies, depending on whether the output is driving a selected or an unselected row line. Control circuit 80 comprises transistors 81-89, inverter 90, and capacitor 92. Transistors 82-89 are all PMOS. All PMOS substrates (n-well) are tied to Vdd. Control circuit 80 must transfer all the different voltages that are necessary to activate memory device 70 or memory cell 50. Table II generalizes the voltages and the modes in which they are applied.

TABLE II

|  | Selected | Deselected |
| --- | --- | --- |
| READ | +3 V | −3 V |
| ERASE | +20 V | 0 V/1 V |
| PROGRAM | −15 V | 1 V/0 V/5 V |

During erase, the output of a corresponding control circuit 80 for a selected row should be +20V. The control circuit 80 for the row has Vdd at +20V, Vss at 0V, Vrr at +20V, and clock input inactive. To select the row, the input is at 0V. The input of 0V causes a signal line 94 to also be at 0V. Transistor 88 turns on and pulls the output up to +20V. A signal line 95 goes to +20V which turns transistor 82 off. With signal line 94 at 0V, transistor 83 is on, and a signal line 96 is pulled up to +20V. Thus transistor 89 is off. (No direct path from Vss to Vdd exists therefore through transistors 88 and 89.)

During erase, the output of a corresponding control circuit 80 for a deselected row is pulled down to within two threshold voltages from 0V. The input is at +5V, causing signal line 95 to go to 0V which turns transistor 82 on and pulls a signal line 97 to +20V. Thus transistor 81 is off and transistor 88 is off. Transistor 83 is also off and signal line 96 is pulled down to a Vt above 0V. Transistor 89 is on till the output is pulled down to two threshold voltages from 0V. This will not effect the deselected memory cells in any way.

During program, the output of a corresponding control circuit 80 for a selected row should be at −15V. The control circuit 80 for the row has Vdd at +5V, Vss at −15V, Vrr at 0V, and clock input active. To select the row, the input is at 5V. Signal line 97 is pulled up to +5V and signal line 95 is at 0V. Transistor 88 is off since signal line 94 is +5V and vdd is +5V. Transistor 83 is off because signal line 97 is at +5V. Transistor 84 is on to pull signal line 96 down to Vt above 0V. As the clock becomes active, transistors 85, 86, and 92 act as a charge pump pumping charge from signal line 96 to Vss. till signal line 96 goes to one Vt below Vss. Therefore, since Vss is at −15V, signal line 96 will reach about −16.5V. When clock input goes high, signal line 98 is coupled high and immediately discharges through transistor 86. This is because signal line 98 is pumped higher than signal line 96 and momentarily turns transistor 86 on. On the falling edge of clock input, signal line 98 is coupled low below signal line 96 and transistor 85 turns on pulling signal line 96 down. As the clock input cycles through, signal line 96 is discharged to Vss through transistors 85 and 86. This is analogous to NMOS clocked pumps used in prior art EEPROMs. Since signal line 96 is pulled down to a Vt below Vss, the output is pulled down through transistor 89 to Vss.

During program, the output of a corresponding control circuit 80 for a deselected row is +5V. The input is at 0V, causing transistor 88 to be on and transistor 89 to be off, since signal line 96 is at +5V. The output is pulled up to +5V through transistor 88 (Vdd=+5V). With signal line 96 at +5V, transistor 89 is off and the charge pump is off.

During read, the output of a corresponding control circuit 80 for a selected row should be at +2V. The control circuit 80 for the row has Vdd at +2V, Vss at −2V, Vrr at −3V, and clock input inactive. To select the row, the input is at 0V, which causes transistor 88 to be on and transistor 89 to be off. Signal line 96 is pulled high to +2V. Transistor 87 is a very weak transistor and will be on, providing a current path between Vrr and Vdd through transistor 83 and inverter 90. But by sizing the transistors 87 and 83, and by making the source of Vrr strong, this current can be sustained and the voltage on signal line 96 can be held close to +2V turning transistor 89 off. Therefore the output is at +2V.

During read, the output of a corresponding control circuit 80 for a deselected row is −2V. Vgg is at +2V. The input is +5V signal line 94 is Vt below Vgg and transistor 88 is off. Transistor 83 is also off. Signal line 96 is pulled down to Vrr through transistor 87. There is no path from Vrr to any other power source. Transistor 89 is on and the output is pulled down to −2V.

FIG. 6 shows a variation of the circuit of FIG. 5. Transistors 88 and 89 of control circuit 80 have been removed and signal line 96 effectively becomes the output of a circuit 100. All modes for circuit 100 are identical to circuit 80 and work the same way.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A memory cell, comprising:
a memory transistor having a control gate, a floating gate, a drain overlapped by said floating gate, a source, and a tunnel oxide area between said control gate and a channel between said drain and source;
a bit line connected to said drain of the memory transistor; and
control means having erasing means for grounding the bit line and said source, and raising the voltage on said control gate such that said floating gate is negatively charged to result in a high threshold voltage for the memory transistor, and said control means having programming means for lowering said control gate to approximately minus 15V, raising the bit line to approximately plus 5V, and floating said source.

2. The memory cell of claim 1, wherein:
said voltage is raised by said erasing means to approximately plus 10V and the bit line comprises a diffusion.

3. The memory cell of claim 1, wherein:
the memory transistor is an MOS device having two levels of polysilicon.

4. The memory cell of claim 1, further comprising:
a charge pump to supply the erasing and programming voltages of the control means.

5. A memory cell, comprising:
a memory transistor having a control gate, a floating gate, a drain overlapped by said floating gate, a source, and a tunnel oxide area between said control gate and a channel between said drain and source, such that the only voltage exceeding plus or minus ten volts during normal operation is applied to said control gate;
a bit line connected to said drain of the memory transistor such that during any operation of the memory cell the bit line does not fall below zero volts or above plus five volts.

6. The memory cell of claim 5, wherein:
the bit line is fabricated with a diffusion that is minimally spaced to other diffusions such that advantage is taken of the fact that the bit line does not fall below zero volts or above plus five volts.

7. A non-volatile memory device for use with a computer central processing unit (CPU), comprising:
a plurality of memory transistors each having a control gate, a floating gate, a drain, a source, and a tunnel oxide area between said control gate and a channel between said drain and source, the memory transistors arranged into an array of memory bits randomly accessible by the CPU;
a plurality of bit lines connected to respective said drains of memory transistors; and
control means having erasing means for grounding the bit line and said source, and raising the voltage on said control gate such that said floating gate is negatively charged to result in a high threshold voltage for the memory transistor, and said control means having programming means for lowering said control gate to approximately minus 15V, raising the bit line to approximately plus 5V, and floating said source.

8. A solid state disk, comprising:

a plurality of nonvolatile memory devices, each memory device having (a) a plurality of memory transistors each having a control gate, a floating gate, a drain, a source, and a tunnel oxide area between said control gate and a channel between said drain and source, the memory transistors arranged into an array of memory bits randomly accessible by the CPU, (b) a plurality of bit lines connected to respective said drains of memory transistors, and (c) control means having erasing means for grounding the bit line and said source, and raising the voltage on said control gate such that said floating gate is negatively charged to result in a high threshold voltage for the memory transistor, and said control means having programming means for lowering said control gate to approximately minus 15V, raising the bit line to approximately plus 5V, and floating said source; and interface means for emulating a magnetic disk drive controller and interface.

9. A method of programming and erasing a nonvolatile memory cell, comprising the steps of:

placing a net negative charge on a floating gate of a transistor with respective to a drain of said transistor that is overlapped by said floating gate such that a very high threshold voltage which may include the depletion state is produced such that when the transistor is accessed in a read mode the transistor will be off wherein a read select transistor is unnecessary.

10. A method of operating a non-volatile memory cell having a bit line and a transistor with a control gate, a floating gate, a drain, and a source, the method comprising the steps of:

erasing the memory cell by grounding both the bit line and source while raising the control gate to a high voltage, such that the floating gate has a negative charge causing the transistor to have a relatively high threshold $V_t$;

programming the memory cell by applying approximately minus 15V to the control gate, approximately plus 5V to the bit line and leaving the source of the transistor floating, such that a field across a tunnel oxide area of the transistor results in the floating gate being stripped of negative charge and such that transistor reaches a relatively low or negative threshold $V_t$; and reading the memory cell by selecting the memory cell by applying approximately plus 3V to the control gate and deselecting by applying approximately minus 3V to the control gate.

11. An electrically erasable programmable read-only memory (EEPROM) including an array of single-transistor memory cells, each single-transistor memory cell comprising:

a control gate electrode connected to a work line conductor;

a tunnel oxide region;

a floating gate electrode disposed between the control gate electrode and tunnel oxide region;

a drain electrode connected to a bit line conductor and including an underlap diffusion to enable electron tunneling through the tunnel oxide region to the floating gate electrode;

a source electrode connected to a common conductor;

erase means for charging the floating gate with a negative charge such that the threshold voltage (Vt) of the single-transistor memory cell is changed to a raised state;

program means for discharging the floating gate of a negative charge such that the threshold voltage (Vt) of the single-transistor memory cell is changed to a non-raised state; and read means for selecting and deselecting the single-transistor memory cell such that said Vt must be said non-raised state to turn on the single-transistor memory cell.

12. The EEPROM of claim 11, wherein:

the erase means comprises means for applying a first voltage between the drain electrode (−) and the control gate electrode (+);

the program means comprises means for applying a second voltage between the drain electrode (+) and the control gate electrode (−); and the read means comprises means for applying a third voltage between the control gate electrode (+) and source electrode (−) to cause the single-transistor memory cell to be selected, for applying said third voltage between the control gate electrode (−) and source electrode (+) to cause the single-transistor memory cell to be deselected.

13. The EEPROM of claim 12, wherein:

said first voltage is approximately twenty volts;

said second voltage is approximately fifteen volts; and said third voltage is approximately three volts.

14. The EEPROM of claim 12, further comprising:

voltage means for generating a substrate negative back bias in the single-transistor memory cell such that:

said first voltage is approximately positive fifteen volts at the control gate electrode and approximately negative five volts at the drain electrode;

said second voltage is approximately negative fifteen volts at the control gate electrode and approximately positive five volts at the drain electrode; and said third voltage is approximately three volts.

15. The EEPROM of claim 11, further comprising:

control circuit means in communication with the erase means and for applying a first voltage between the drain electrode (−) and the control gate electrode (+), the control circuit means in communication with the program means for applying a second voltage between the drain electrode (+) and the control gate electrode (−), and the control circuit means in communication with the read means and for applying a third voltage between the control gate electrode (+) and source electrode (−) to cause the single-transistor memory cell to be selected, for applying said third voltage between the control gate electrode (−) and source electrode (+) to cause the single-transistor memory cell to be deselected.

16. The EPROM of claim 15, wherein:

said first voltage is approximately twenty volts;

said second voltage is approximately fifteen volts; and said third voltage is approximately three volts.

17. The EEPROM of claim 15, further comprising:

voltage means for generating a substrate negative back bias in the single-transistor memory cell such that:

said first voltage is approximately positive fifteen volts at the control gate electrode and approximately negative five volts at the drain electrode;

said second voltage is approximately negative fifteen volts at the control gate electrode and approximately positive five volts at the drain electrode; and said third voltage is approximately three volts.

18. A method of using a conventional flash memory cell, comprising a substrate, a floating gate, a control gate, a source and a drain, to operate as a single-transistor memory cell in which the source and drain are interchanged to enable electron tunneling to occur between the floating gate and drain, the method comprising the following steps in any order:

erasing the single-transistor memory cell by applying a first voltage on the control gate and a second voltage lower and opposite in polarity to the first voltage on the drain, source and substrate;

writing the single-transistor memory cell by applying a negative third voltage on the control gate and a lower positive fourth voltage on the drain only when this particular the single-transistor memory cell is to be altered by lowering threshold voltage (Vt), and applying one of zero volts or floating the drain when the single-transistor memory cell is not to be altered; and reading the single-transistor memory cell by applying a small positive fifth voltage on the control gate of selected memory cells and a negative sixth voltage that is less than the depletion Vt of a written single-transistor memory cell on the control gates of unselected memory cells wherein the incorporation of complex algorithms to support an erase operation is avoided.

* * * * *